(12) United States Patent
Nick

(10) Patent No.: US 11,815,214 B2
(45) Date of Patent: Nov. 14, 2023

(54) BLIND MATE FLUID COUPLING WITH MISALIGNMENT COMPENSATION

(71) Applicant: Parker-Hannifin Corporation, Cleveland, OH (US)

(72) Inventor: Leonard Nick, Rockford, MN (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 17/847,950

(22) Filed: Jun. 23, 2022

(65) Prior Publication Data

US 2022/0412496 A1    Dec. 29, 2022

Related U.S. Application Data

(60) Provisional application No. 63/289,251, filed on Dec. 14, 2021, provisional application No. 63/216,166, filed on Jun. 29, 2021.

(51) Int. Cl.
| | |
|---|---|
| *F16L 37/52* | (2006.01) |
| *F16L 37/34* | (2006.01) |
| *F16L 37/35* | (2006.01) |

(52) U.S. Cl.
CPC .............. *F16L 37/52* (2013.01); *F16L 37/34* (2013.01); *F16L 37/35* (2013.01)

(58) Field of Classification Search
CPC . F16L 37/34; F16L 37/35; F16L 29/04; F16L 37/52; F16L 37/50; H05K 7/20272; H05K 7/20772
See application file for complete search history.

(56) References Cited

U.S. PATENT DOCUMENTS 3,508,580 A * 4/1970 Snyder, Jr. .............. F16L 37/50
137/614.04
3,645,294 A * 2/1972 Allread ................... F16L 37/34
137/614

(Continued)

FOREIGN PATENT DOCUMENTS

| DE | 4323758 A1 | 4/1994 |
|---|---|---|
| EP | 0547435 A1 | 6/1993 |

(Continued)

OTHER PUBLICATIONS

Extended European Search Report issued for corresponding EP Application No. EP 22181009.6, dated Nov. 8, 2022.

(Continued)

*Primary Examiner* — David Colon-Morales
(74) *Attorney, Agent, or Firm* — Renner, Otto, Boisselle & Sklar, LLP

(57) ABSTRACT

A coupling member for a blind mate fluid coupling includes a housing and a fluid connector fixed in position relative to the housing for connecting to a fluid conduit of the system. A valve body movable relative to the housing includes a fluid passage that is fluidly connected to the connector. A carrier is at least partially disposed in the housing and is radially movable relative to the housing. The carrier is configured to cooperate with the valve body to facilitate alignment of the valve body when coupling to another coupling member. The carrier may form a portion of the fluid passage between the connector and valve body, and includes a sealing arrangement that permits radial and/or angular misalignment compensation of the design. Varying diameters of the insertion part or receiving part of the coupling member may be provided for further enhancing misalignment compensation of the design.

19 Claims, 11 Drawing Sheets

(56) References Cited

U.S. PATENT DOCUMENTS

| | | | | |
|---|---|---|---|---|
| 4,269,226 | A | 5/1981 | Allread | |
| 4,886,301 | A * | 12/1989 | Remsburg | F16L 37/56 285/39 |
| 5,123,446 | A * | 6/1992 | Haunhorst | F16L 37/23 137/614 |
| 5,322,330 | A * | 6/1994 | Remsburg | F16L 37/34 285/39 |
| 5,398,723 | A * | 3/1995 | Allread | F16L 37/34 137/614.04 |
| 5,975,490 | A | 11/1999 | Essman | |
| 6,866,064 | B2 * | 3/2005 | Nanni, Jr. | F16L 37/0887 137/15.09 |
| 6,923,476 | B2 * | 8/2005 | Smith, III | E21B 33/038 285/108 |
| 7,275,563 | B2 * | 10/2007 | Tiberghien | F16L 29/04 251/149.6 |
| 8,028,718 | B2 * | 10/2011 | Tiberghien | F16L 29/04 251/149.6 |
| 9,194,634 | B2 * | 11/2015 | Tiberghien | F16L 37/34 |
| 9,351,428 | B2 * | 5/2016 | Eckberg | F16L 37/34 |
| 10,181,677 | B2 * | 1/2019 | Vassgård | H01R 13/523 |
| 10,815,746 | B2 | 10/2020 | Holst et al. | |
| 11,359,753 | B2 * | 6/2022 | Raad | F16L 37/32 |
| 2009/0033089 | A1 | 2/2009 | Tiberghien et al. | |
| 2016/0066480 | A1 | 3/2016 | Eckberg et al. | |
| 2022/0049806 | A1 | 2/2022 | Raad | |
| 2022/0349503 | A1 * | 11/2022 | Durieux | F16L 37/02 |

FOREIGN PATENT DOCUMENTS

| | | | | |
|---|---|---|---|---|
| EP | 1953440 A1 * | 8/2008 | | F16L 29/04 |
| EP | 2966396 A1 * | 1/2016 | | B23P 15/26 |
| EP | 2966396 A1 | 1/2016 | | |
| GB | 2404955 A * | 2/2005 | | F16L 33/16 |
| GB | 2409502 A | 6/2005 | | |
| WO | 2007133793 A2 | 11/2007 | | |
| WO | WO-2007133793 A2 * | 11/2007 | | A61M 39/18 |
| WO | 2013078043 A1 | 5/2013 | | |
| WO | WO-2013078043 A1 * | 5/2013 | | B67D 7/3218 |
| WO | WO-2022180569 A1 * | 9/2022 | | |

OTHER PUBLICATIONS

Staubli, CGO/CGD, "Thermal management and cooling of electronics," Oct. 27, 2014.

* cited by examiner

BLIND MATE FLUID COUPLING WITH MISALIGNMENT COMPENSATION

RELATED APPLICATIONS

This application claims the benefit of both U.S. Provisional Application No. 63/216,166 filed Jun. 29, 2021, and U.S. Provisional Application No. 63/289,251 filed Dec. 14, 2021, each of which is hereby incorporated herein by reference in its entirety.

TECHNICAL FIELD

The present invention relates generally to couplings, and more particularly to a blind mate fluid coupling with misalignment compensation functionality.

BACKGROUND

Fluid couplings are commonly used to connect fluid lines in a variety of applications. Often these couplings include a male member and a female member that are mated together for fluid connection between fluid lines of a system. The male member generally includes a projecting portion at one end for insertion into a receiving end of the female member. When the projecting portion of the male member is inserted into the receiving end of the female member, fluid flow may be established through flow passages in each of the coupling members. Typically, one or both of the coupling members include a valve member that is opened to permit fluid flow when the coupling members are fully-mated together, and that is closed to terminate fluid flow when the coupling members are disconnected.

One type of fluid coupling that is often used in the electronics industry for thermal management applications, for example, is a blind mate fluid coupling. Conventionally, each coupling member of a blind mate coupling is mounted on a plate or manifold, such as with one coupling member mounted in an electrical cabinet and the other coupling member mounted on a modularly removable rack or blade carrying electronics. The mating action between the coupling members of the blind mate coupling occurs via a sliding motion between the plate and manifold (e.g., cabinet and rack/blade) which can be accomplished without tools and without visually seeing the connection sequence. Typically, such blind mate couplings have minor self-aligning features which allows a small amount of misalignment between the coupling members when mating them together.

SUMMARY

One issue with conventional blind mate coupling designs is that the amount of misalignment allowed when mating the coupling members together may be insufficient for many applications. For example, a conventional blind mate coupling may allow up to only 1 mm of maximum radial misalignment and essentially zero angular misalignment between the coupling members. When trying to expand the use of such blind mate couplings into more broadly accepted applications, such as electronic data centers, the tolerances of the enclosures for these applications may not be as tightly controlled as more conventional or sophisticated applications. Therefore, more misalignment tolerance is needed in the mating between coupling members to maintain the current proven and economical manufacturing processes for such applications.

An aspect of the present disclosure provides a blind mate coupling or coupling member that enhances the misalignment compensating capabilities of the design.

More particularly, according to an aspect, an exemplary blind mate fluid coupling is provided that enhances the misalignment compensating capabilities of a rigid fluid connection design by providing a sealed carrier within the coupler housing that serves as an alignment mechanism for the valve body which enables proper connection to a corresponding fluid coupler.

According to an aspect, a coupling member for a blind mate fluid coupling includes: a housing; a fluid connector configured to connect to a fluid conduit, the fluid connector being fixed in position relative to the housing; a valve body at least partially extending through the housing and being movable relative to the housing, the valve body having an internal fluid passage that is fluidly connected to the fluid connector; a valve member at least partially disposed in the internal fluid passage, the valve member being movable relative to the valve body to open or close the internal fluid passage; and a carrier at least partially disposed in the housing, the carrier being radially movable relative to the housing and configured to cooperate with the valve body to facilitate alignment of the valve body.

According to another aspect, a coupling member for a blind mate fluid coupling includes: a housing; a valve body at least partially extending through the housing and being movable relative to the housing, the valve body having an internal fluid passage; a valve member at least partially disposed in the internal fluid passage, the valve member being movable relative to the valve body to open or close the internal fluid passage; a fluid connector external of the housing and being configured to connect to a fluid conduit; and a carrier at least partially disposed in the housing, the carrier being movable relative to the housing and configured to cooperate with the valve body to facilitate alignment of the valve body; wherein the carrier includes an internal fluid passage that fluidly interconnects an internal fluid passage of the fluid connector to the internal fluid passage of the valve body.

According to another aspect, a coupling member for a blind mate fluid coupling, includes: a valve body extending along a longitudinal axis and having an internal fluid passage; a valve member at least partially disposed in the internal fluid passage, the valve member being movable relative to the valve body to open or close the internal fluid passage; wherein a portion of the valve body includes a first diameter, a second diameter, and a third diameter; wherein the first diameter is toward a forward portion of the valve body, the third diameter is longitudinally spaced apart in a rearward direction from the first diameter, and the second diameter is intermediate the first diameter and the third diameter; and wherein the second diameter is greater or less than both the first diameter and the third diameter for enabling enhanced misalignment when mating with another coupling member.

In exemplary embodiments, the coupling member is a male coupling member having a forward nose portion of the valve body configured for insertion into a receptacle of a female coupling member, wherein the forward nose portion of the valve body has a radially outer surface that forms the first, second, and third diameters as respective first, second and third outer diameters of the valve body.

In exemplary embodiments, the coupling member is a female coupling member having a receptacle at a forward end of the valve body configured for receiving part of a male coupling member, wherein at least a portion of the receptacle forms an internal passage having the first, second, and third diameters as respective first, second and third internal diameters.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects of the invention.

DETAILED DESCRIPTION

The principles and aspects according to the present disclosure have particular application to blind mate fluid couplings, such as for fluid flow control and thermal management in electronics applications, and thus will be described below chiefly in this context. It is understood, however, that the principles and aspects according to the present disclosure may be applicable to other types of couplings for other applications, including non-fluid applications where desirable, as would be understood by those having ordinary skill in the art. For example, the exemplary blind mate couplings may be used for electrical, acoustic, or optical applications, which may be applicable to the aerospace, automotive, manufacturing, or energy industry, or any other suitable industry for any suitable application.

Figure 1:
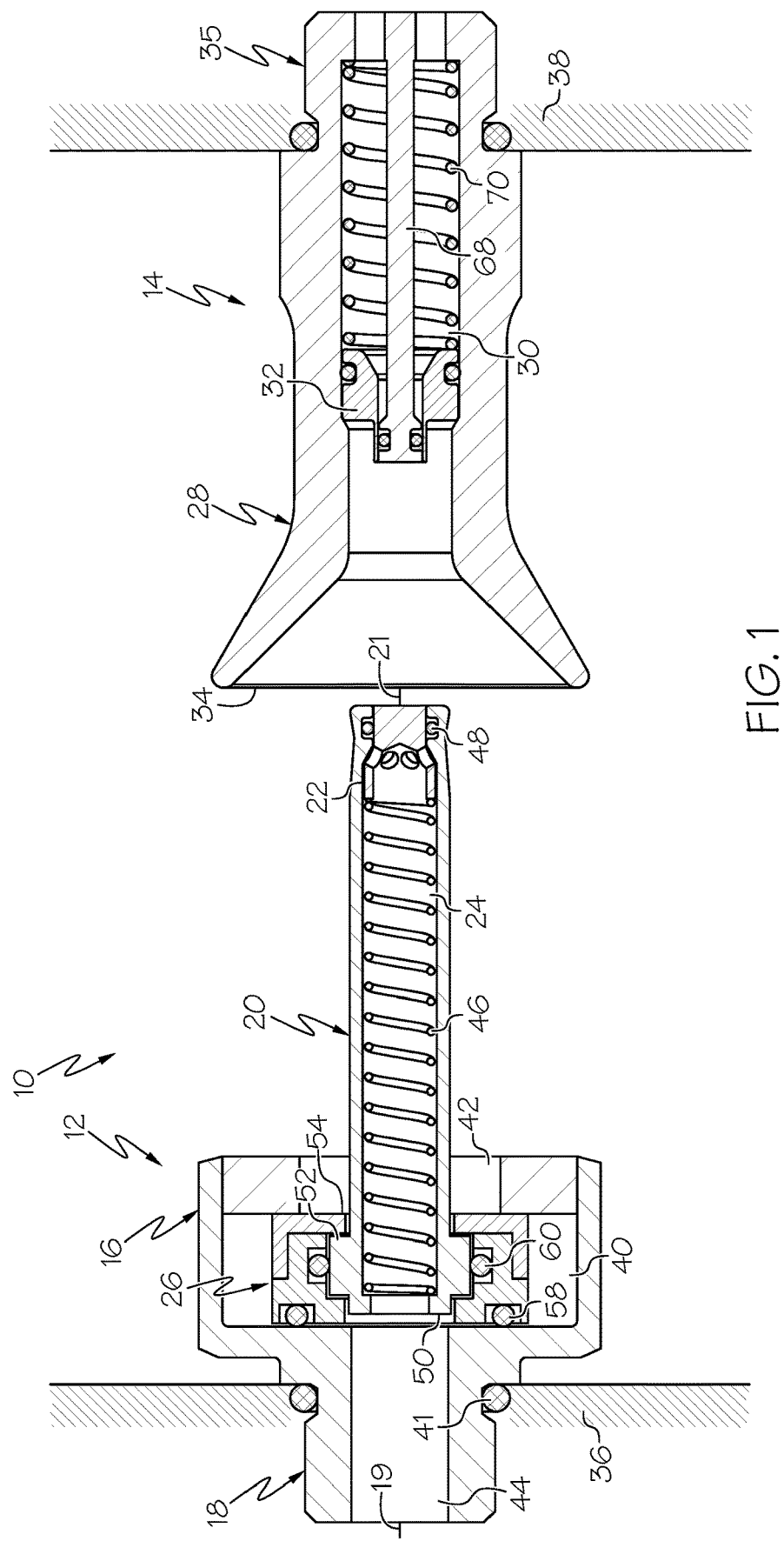
FIG. 1 is a cross-sectional side view of an exemplary blind mate fluid coupling including an exemplary male coupling member and an exemplary female coupling member according to an embodiment of the present disclosure, in which the blind mate coupling is shown in an exemplary neutral and decoupled state.
Figure 2:
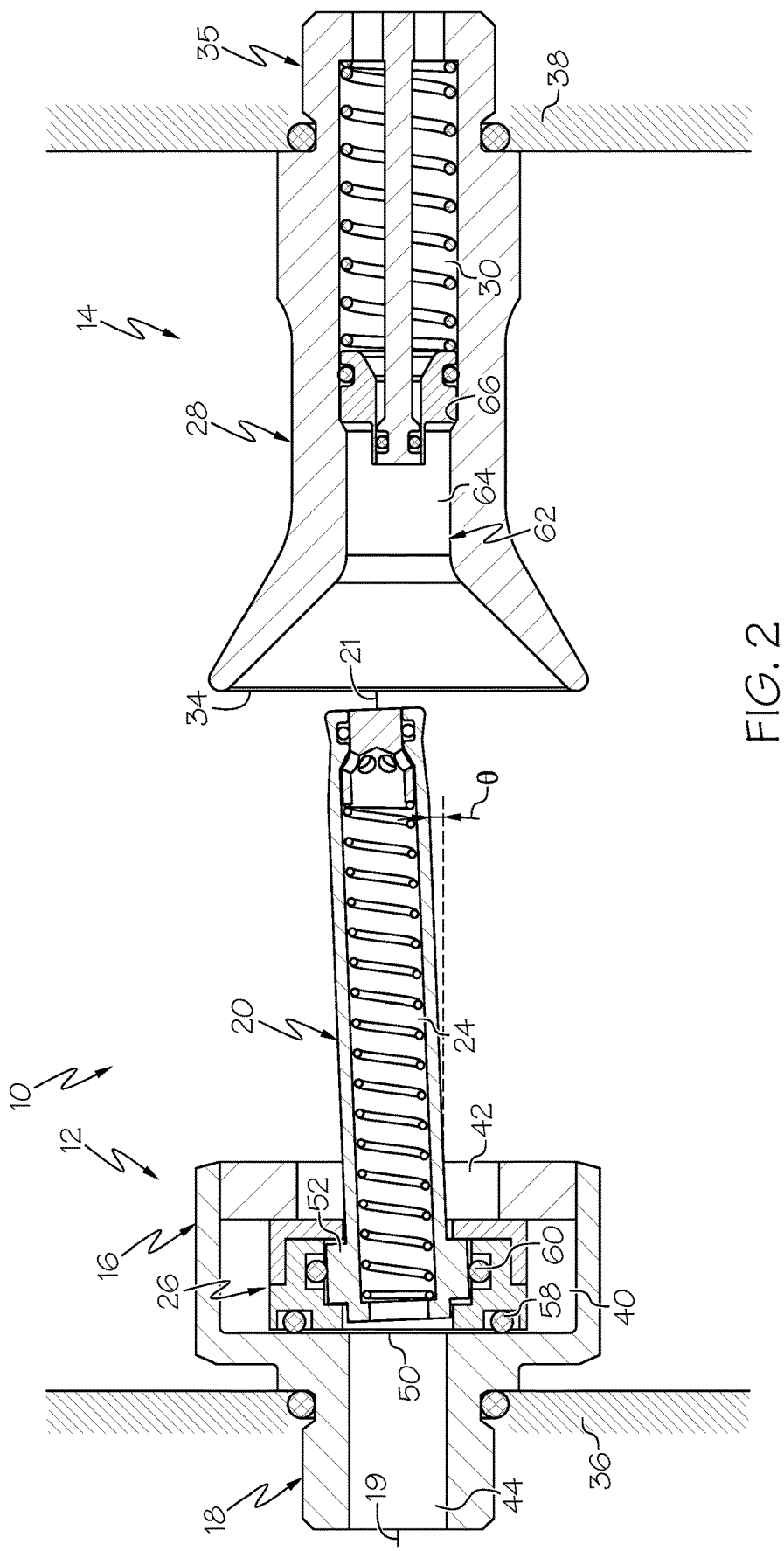
FIG. 2 is a cross-sectional side view of the blind mate coupling in FIG. 1 in which the male member angularly misaligned.
Figure 3:
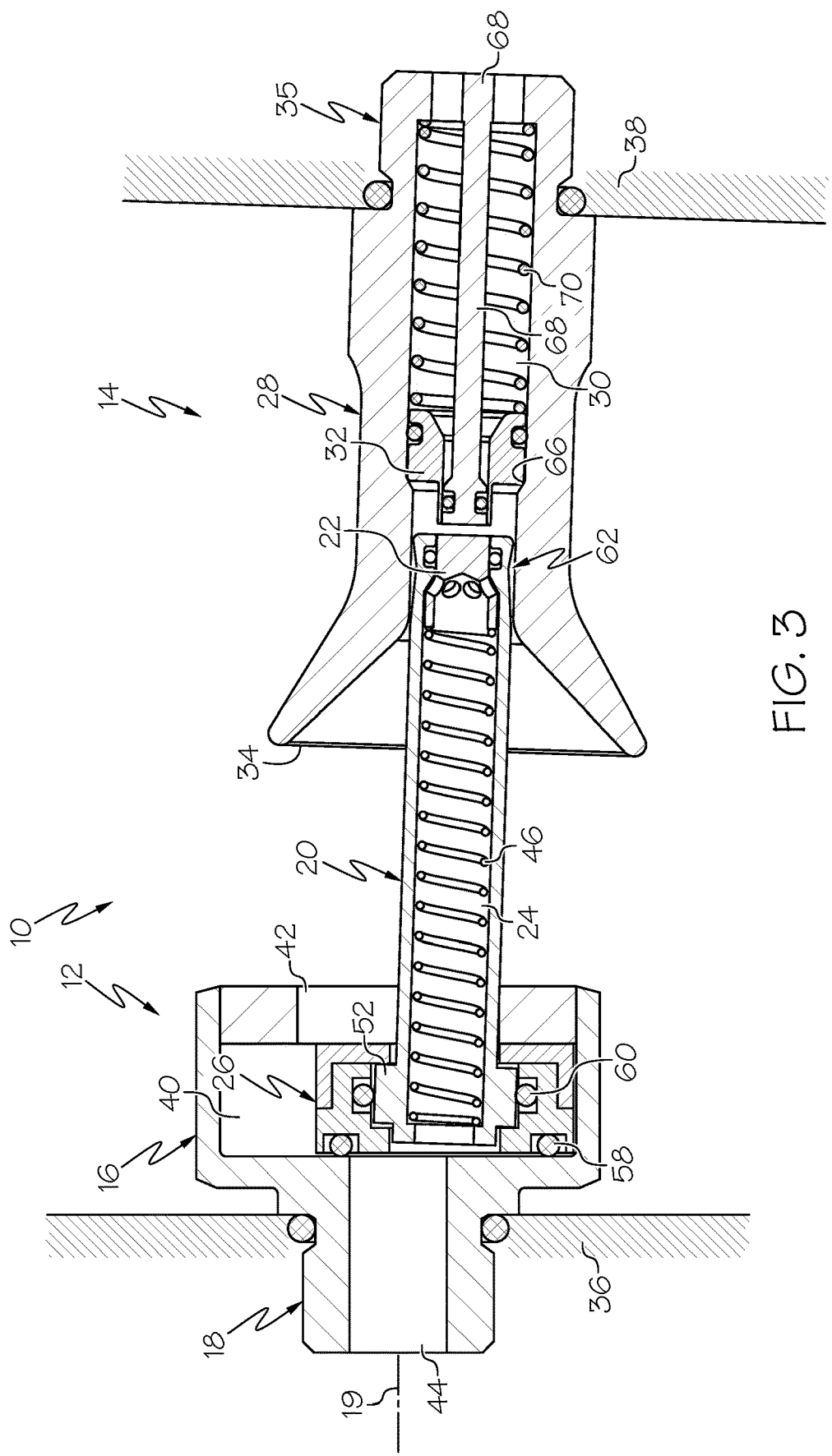
FIG. 3 is a cross-sectional side view of the blind mate coupling in FIG. 1 in which the male member is radially and angularly misaligned and is in initial mating and closed state with the female coupling member.

Referring to FIGS. 1-3, an exemplary blind mate fluid coupling 10 is shown. As shown, the blind mate coupling 10 generally includes two coupling members, including an exemplary male coupling member 12 (also referred to as a male member, male coupler, or male nipple) and an exemplary female coupling member 14 (also referred to as a female member or female coupler). As is well-understood in the art, such quick connect coupling members 12, 14 may be mated together for fluid connection between fluid lines of a system to establish fluid flow through the system, or may be disconnected from each other to terminate flow through the coupling members.

The exemplary male member 12 generally includes a housing 16, a fluid connector 18 operatively coupled to the housing and configured to connect to a fluid conduit of the system, a valve body 20 at least partially extending through the housing 16, and a valve member 22 at least partially disposed in an internal fluid passage 24 of the valve body 20 for opening or closing fluid communication through the passage 24. As will be described in further detail below, to provide misalignment compensating functionality to the male member 12, the male member 12 also includes a carrier 26 that is at least partially disposed in the housing 16 and is configured to cooperate with the valve body 20 to facilitate alignment and/or centering of the valve body 20 when coupling to the female member 14.

The female member 14 generally includes a valve body 28 with an internal fluid passage 30 and a valve member 32 disposed within the internal fluid passage 30. As shown, a forward portion of the female valve body 28 includes a receptacle 34 (also referred to as a socket or receiver) that is configured to receive a corresponding forward portion of the male valve body 20. The female valve member 32 is configured to move relative to the female valve body 28 for opening and closing the internal fluid passage 30 when the male member 12 is fully coupled or decoupled, respectively, from the female member 14. As shown, a rearward portion of the female member 14 includes a fluid connector 35 that is configured to fluidly connect to a fluid conduit (not shown) of the system via suitable threads or the like.

In exemplary embodiments, the blind mate fluid coupling 10 is used for thermal management applications to establish fluid flow between a heat exchanger (e.g., cold plate) and a fixed manifold to allow for quick removal and replacement of the components of the thermal management system. The fluid in such applications may be a liquid, such as water or a water-based liquid, or may include glycol, or may be a gas, or may be a two-phase liquid-gas such as a refrigerant, or may be any other suitable fluid (e.g., liquid and/or gas) for the thermal management application, as would be understood by those having ordinary skill in the art.

In the illustrated embodiment, for example, the housing 16 of the male member 12 may be mounted to a platform 36, such as a plate, drawer, rack, blade, or other suitable removable platform or structure carrying electronic components to be cooled via fluid flow established via connection of the male member 12. Such modular components may be used for PcIe expansion or other expansion interfaces carrying electronics (e.g., processors, memory storage devices, communications interfaces, etc.) that may be added to or removed from a computer environment, for example. The fluid flow may be established via a suitable fluid conduit of the cooling circuit (not shown), in which the fluid conduit may be a part of, or may be fluidly connected to, fluid equipment or machines, such as heat exchanger equipment (e.g., cold plate, etc.) that is in thermal communication with the electronics. Similarly, the female member 14 may be mounted on a platform 38, such as a manifold, plate, drawer, electrical cabinet or other structure within which the expansion unit (e.g., drawer, rack, blades, etc.) carrying the modular expansion electronics are inserted or removed.

As shown in the illustrated embodiment, the male housing 16 forms an internal chamber 40 that contains the carrier 26 and a rearward end of the valve body 20. In this manner, the housing 16 supports the valve body 20, which extends forwardly to protrude from the housing 16 to make the connection with the female member 14. The housing 16 may have any suitable shape or form as may be desired for the application. In the illustrated embodiment, the housing 16 has a generally cylindrical shape which facilitates movement of the carrier 26 and valve body 20 about 360-degrees of misalignment relative to a central axis of the housing 16. As shown, the housing 16 may be formed of multiple parts, which facilitates assembly of the carrier 26 and rearward portion of the valve body 20 within the housing 16. The male member 12 may be mounted to the platform 36 in any suitable manner, such as via coupling, fastening, brazing, welding or the like.

The fluid connector 18 is operatively coupled to the housing 16 and enables connection to a fluid circuit of the system via a fluid conduit (not shown). In exemplary embodiments, the fluid connector 18 is fixed in position relative to the housing 16. Such fixed positioning may be beneficial when the fluid conduit connected to the connector 18 is a rigid conduit, such as a metal tube. The fluid connector 18 may be fixed to the housing 16 in any suitable manner, such as by threading, welding, or being unitary with the housing (as shown). In the illustrated embodiment, the connector 18 extends from a rearward portion of the housing 16 along a longitudinal axis 19 that is coaxial with the central axis of the housing 16. The fluid connector 18 includes an internal fluid passage 44 that is fluidly connected to the internal fluid passage 24 of the valve body 20. The fluid connector 18 may include suitable threads to threadedly couple with a nut of the conduit to make a secure connection, for example. In the illustrated embodiment, the connector 18 is coupled to a manifold or conduit (not shown) via the threads, which secures the male member 12 relative to the platform 36. An O-ring 41 is provided that seals the fluid passages from the outside environment.

The valve body 20 extends along a longitudinal axis 21 and forms the internal fluid passage 24, which is fluidly coupled to a fluid passage 44 of the connector 18, and thus constitutes a portion of the overall fluid passage of the male member 12. Generally, the valve body 20 may have any suitable shape or form as may be desired for the particular application. In the illustrated embodiment, the valve body 20 has an elongated forward nose with a generally cylindrical outer surface. As shown, the rearward portion of the valve body 20 is contained in the housing 16 and the forward (nose) portion of the valve body 20 extends through a forward opening 42 in the housing 16. The valve body 20 extends along the longitudinal axis 21 and projects substantially forward from the housing 16 for facilitating insertion into the receptacle 34 of the female member 14.

The male valve member 22 may have any suitable shape or form for opening or closing the internal fluid passage 24 of the valve body 20. In exemplary embodiments, the valve member 22 is formed as a flow sleeve or poppet that is slidably disposed within the valve body 20 to move between open and closed positions. As shown, a biasing member 46 is disposed within the valve body 20 (e.g., within the fluid passage 24) and biases the valve member 22 forwardly toward the closed position where the valve member 22 sealingly engages against a sealing surface, such as a valve seat, with a suitable seal 48 (e.g., O-ring seal). The biasing member 46 may be any suitable member for biasing the valve member 22, such as a spring, for example a coil spring. The biasing member 46 may engage an internal spring seat, or internal abutment, inside the fluid passage 24 which may be formed by a portion of the valve body 20.

FIG. 1 shows the exemplary male member 12 in its decoupled and neutral state, in which the valve body 20 is centered in the housing 16 and the valve body axis 21 is coaxially aligned with the longitudinal axis 19 of the fluid connector 18. In FIG. 1, the male member 12 also is generally aligned with the female member 14. It is understood, however, that the male and female coupling members 12, 14 may be misaligned with respect to each other during the connection sequence, which may be caused by misalignments and/or tolerance issues (e.g., stack-up) between the structures 36, 38 holding the coupling members 12, 14, for example. The issues caused by such misalignment may be exacerbated when one or both of the coupling members 12, 14 is rigidly mounted in its corresponding structure 36, 38, as is the case in the illustrated embodiment. Thus, to provide a suitable connection between the coupling members 12, 14, the exemplary male member 12 utilizes the carrier 26 as an alignment mechanism that cooperates with the male valve body 20 to compensate for misalignment between the male and female coupling members 12, 14.

The carrier 26 generally may have any suitable shape or form for interacting with both the housing 16 and the valve body 20 to provide the misalignment compensating capabilities (also referred to as self-alignment) of the device. In exemplary embodiments, the carrier 26 is configured to compensate for both angular misalignment and radial misalignment of the valve body 20 relative to the female valve body 28, as described in further detail below. As shown, the carrier 26 may be formed by multiple parts to facilitate assembly of a portion of the valve body 20 and/or other components therein.

Referring to FIG. 2, the male valve body 20 is shown angularly misaligned relative to the female valve body 28 by an angle ($\Theta$). As shown in the illustrated embodiment, to provide such angular misalignment, an axially rearward end portion of the valve body 20 is contained within an internal cavity 50 of the carrier 26, and this axially rearward portion of the valve body 20 is sized and dimensioned relative to the cavity 50 to permit the desired degree of angular misalignment. In this manner, the carrier 26 essentially serves as a pivot for the male valve body 20 to permit the desired amount of angular misalignment. The carrier 26 and valve body 20 each may have a generally cylindrical form, which enables the angular misalignment to occur 360-degrees about a central axis of the carrier 26 (e.g., within a conical region around the central axis). As shown, such movement of the valve body 20 will cause the axis 21 of the valve body 20 to be misaligned with the axis 19 of the fluid connector 18 because the fluid connector 18 and housing 16 are fixed in position relative to the valve body 20.

In exemplary embodiments, the rearward portion of the valve body 20 includes at least one radially protruding shoulder 52, or abutment, having corresponding shoulder surfaces that interact with the internal surfaces of the carrier 26 for providing the desired amount of angular misalignment. As shown, the shoulder 52 may be unitary with a main body portion of the valve body 20; however, it is understood that the shoulder 52 may be attached to the main body in any suitable manner. To constrain axially forward movement of the male valve body 20 (in the direction of the longitudinal axis 21), the carrier 26 may include a forward abutment 54 that is configured to engage with the shoulder 52 of the valve body, thereby preventing the valve body 20 from being detached from the male member 12. In the illustrated embodiment, the carrier 26 also includes a rearward abutment 56 that engages the shoulder 52 to constrain axially rearward movement of the valve body 20; although it is possible that a rearward portion of the housing 16 could achieve this as well. As is apparent in the illustrated embodiment, the forward opening 42 in the housing 16 and an opening in the forward abutment 54 of the carrier 26 are each sized to permit the desired amount of angular displacement of the valve body 20.

Turning to FIG. 3, the male valve body 20 is shown radially misaligned relative to the female valve body 28. In the illustrated embodiment, the valve body 20 also is shown angularly misaligned at a maximum amount of angular displacement. To enable such radial misalignment, the carrier 26 is contained within the internal chamber 40 of the housing 16 and is configured to float radially relative to the housing 16, such that the carrier 26 also carries and radially displaces the valve body 20. In this manner, the degree of radial misalignment is at least partially defined by the spacing between the radially outer surface of the carrier 26 and the radially inner surface of the housing 16 defining the chamber 40. As noted above, the housing 16 and carrier 26 each may have a generally cylindrical form, which enables the radial displacement to occur 360-degrees about a central axis of the housing 16 (e.g., within a cylindrical region around the central axis). As is apparent in the illustrated embodiment, the forward opening 42 is sized to permit the desired amount of radial displacement of the valve body 20 relative to the housing 16.

Because the movable valve body 20 is physically decoupled from the fixed fluid connector 18, and the carrier 26 bridges the region therebetween, the internal cavity 50 of the carrier 26 is configured to fluidly connect the respective fluid passages 24, 44 of the valve body 20 and connector 18 and thereby form a portion of the overall fluid flow passage of the male member 12. Accordingly, to provide suitable sealing of fluid flowing through the carrier 26 when radial and/or angular displacement of the valve body 20 occurs, an exemplary seal arrangement is provided between respective interfaces of the housing 16, carrier 26, and valve body 20.

In the illustrated embodiment, for example, the male coupling member 12 includes a face seal 58 between a rearward face of the carrier 26 and an internal face of the housing 16. The face seal 58 is configured to permit the carrier 26, and thus the valve body 20, to move radially within the chamber 40 about the central axis of the housing 16. To maintain suitable sealing engagement of the face seal 58, the carrier 26 may be axially constrained between the forward and rearward walls of the housing 16. In addition, the male coupling member 12 may include another seal 60 between the valve body 20 and a portion of the carrier 26.

In the illustrated embodiment, the seal 60 is an O-ring seal (also referred to as an OD/ID seal) between a radially outer surface of the shoulder 52 and a radially inner surface of the carrier 26. To maintain the sealing engagement between the valve body 20 and the carrier 26, the shoulder 52 is sized and dimensioned to be relatively tightly constrained within the carrier 26, except to the extent to permit pivoting action and enable the angular misalignment of the valve body 20 as described above.

Still referring to FIG. 3, the receptacle 34 of the female member 14 is configured to receive the forward portion of the male valve body 20 to couple the coupling members 12, 14 together. In exemplary embodiments, the receptacle 34 is in the form of a funnel or cone which includes a wide forward mouth for catching the forward nose of the male valve body 20. As the coupling members 12, 14 are pushed toward each other, the male valve body 20 is guided by the tapered (funnel) portion of the female receptacle 34 to align with the female member 14.

Figure 4:
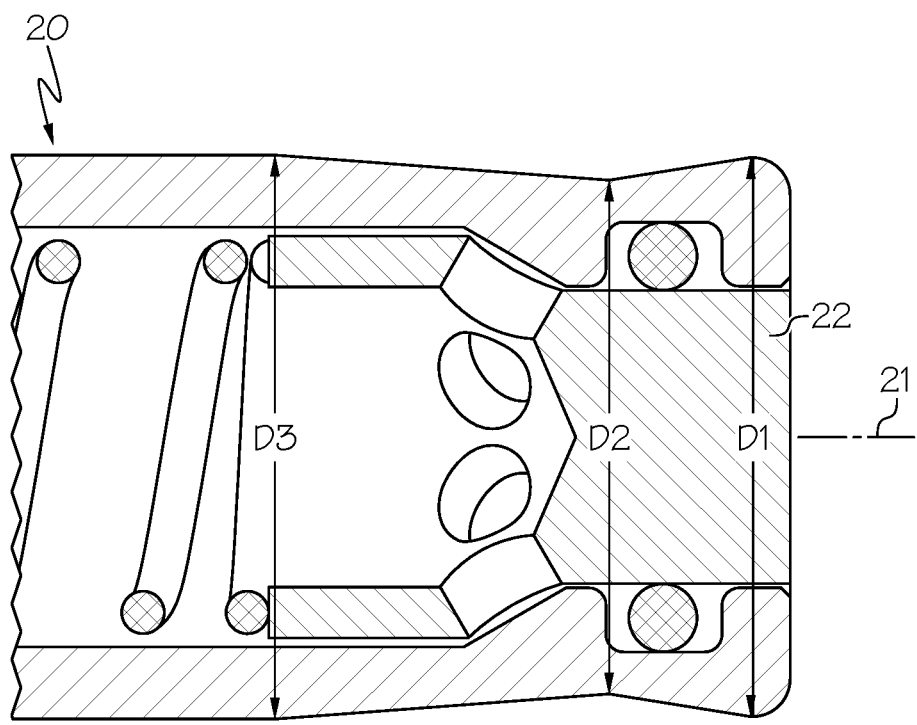
FIG. 4 is an enlarged cross-sectional side view of a forward nose portion of the male coupling member in FIG. 1.
Figure 5A:
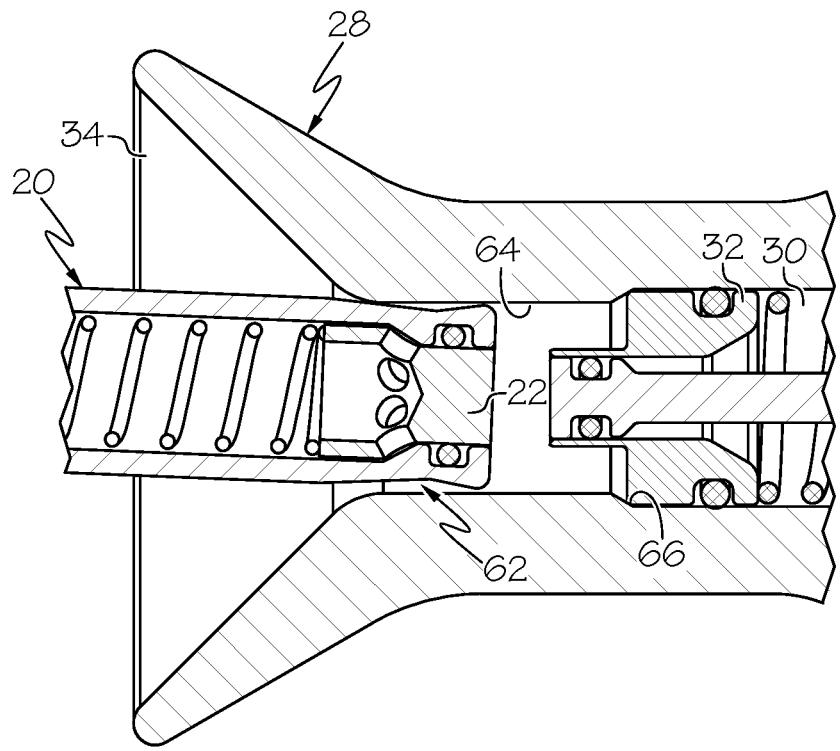
FIG. 5A is an enlarged cross-sectional side view of the blind mate coupling shown in FIG. 1 in which the male member is angularly misaligned and in its initial mating and closed state with the female coupling member.
Figure 5B:
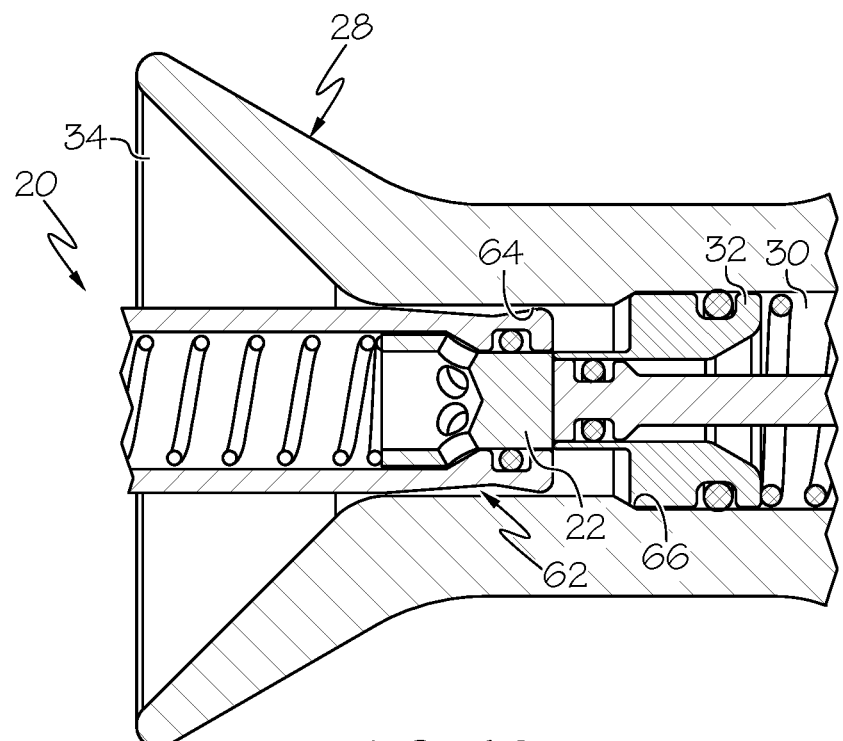
FIG. 5B is an enlarged cross-sectional side view of the blind mate coupling shown in FIG. 5A in which the male member is further inserted into the female coupling member to provide alignment, but is still in its closed state.

Turning now to FIGS. 4-5B, enlarged views of the forward nose of the male valve body 20 being inserted into a forward receiving portion 62 of a bore 64 of the female member 14 is shown. As shown, the bore 64 forms a narrowed portion of the receptacle 34 which is upstream of a valve seat 66 of the female valve member 32. In exemplary embodiments, the radially outer surface of the forward nose of the male valve body 20 has different external diameters at longitudinally spaced positions for enabling greater initial misalignment when the nose of the valve body 20 is inserted into the bore 64. In the illustrated embodiment, for example, the forward nose portion of the male valve body 20 has a first external diameter (D1) at a forward portion that is initially received into the receiving portion 62 of the female member 14, a second external diameter (D2) rearwardly spaced from the first internal diameter (D1), and a third external diameter (D3) at a location rearwardly spaced apart from the second diameter (D2). As shown, the second external diameter (D2) is less than both the first (D1) and third (D3) external diameters for enabling a greater angle of misalignment when the male valve body 20 is initially inserted into the receiving portion 62 of the female member 14. In this manner, the first diameter (D1) may direct the initial positional alignment, the second diameter (D2) may allow for greater angular misalignment, and the combination of the first (D1) and third (D3) diameters may bring the coupling members 12, 14 into full alignment. Such varying diameters are in the forward portion of the nose in a manner that alignment occurs prior to opening of the coupling members 12, 14 when fully-mated. It is noted that in exemplary embodiments, the first (D1) and third (D3) diameters may be different, while in other embodiments the first (D1) and third (D3) diameters may be the same or substantially the same as shown in the illustrated embodiment. The radially outer surface of the nose portion of the male valve body 20 may have a tapered surface, such as a continuous taper (as shown), between the first D1 and second D2 diameters, and a tapered surface (e.g., continuous taper) between the second D2 and third D3 diameters to further facilitate alignment. It is understood, of course, that the nose of the male valve body 20 may have more than three different diameters. It is furthermore noted that while the different diameters are shown on a single nose piece of the male member 12, the different diameters also could be provided with different components operatively coupled or cooperating together.

An exemplary connection sequence of the blind mate coupling 10 will now be described in further detail.

Referring to FIGS. 3 and 5, for example, the blind mate coupling 10 is shown in an initial mating state in which the nose of the male valve body 20 has been inserted into the receptacle 34 of the female member 14 and is guided by the tapered funnel into the receiving portion 62 of the female bore 64. In the illustrated state, sufficient mating engagement has not yet been made to transition the male valve member 22 and female valve member 32 from closed to open, and thus fluid communication is not established between the coupling members 12, 14.

The female valve member 32 is configured to move relative to the female valve body 28 for opening and closing the internal fluid passage 30 when the male member 12 is fully coupled or decoupled, respectively, from the female member 14. In the illustrated embodiment, the female valve member 32 is formed as a valve sleeve that surrounds a fixed valve stem portion 68. A biasing member 70 surrounds the stem portion 68 and biases the valve member 32 toward closed where the valve member 32 sealingly engages against one or more sealing surfaces, such as one or more seals.

As the male valve body 20 is further inserted into the female valve body 28, the male valve member 22 abuts the stem portion 68 of the female member 14 and overcomes the biasing force of the male biasing member 46 to urge the male valve member 22 rearwardly toward open. At the same time, the female valve member 32 abuts a forward face of the male valve body 20 and overcomes the biasing force of the female biasing member 70 to urge the female valve member 32 toward open. When both valve members 22, 32 are open, fluid communication is established between the coupling members 12, 14.

When the female coupling member 14 and male coupling member 12 are decoupled from each other, the respective valve members 22, 32 each close. In exemplary embodiments, the male member 12 does not have a centering spring that returns the male valve body 20 and/or carrier 26 to the central axis of the housing 16. Rather, the male valve body 20 may remain in an angularly and/or radially displaced position in which case the wide mouth of the female receptacle 34 enables the male valve body 20 to be received therewithin. It is understood, however, that a suitable centering spring could be provided in the male member 12 to provide self-centering functionality of the male valve body 20 and/or carrier 26 relative to the housing 16.

Figure 6A:
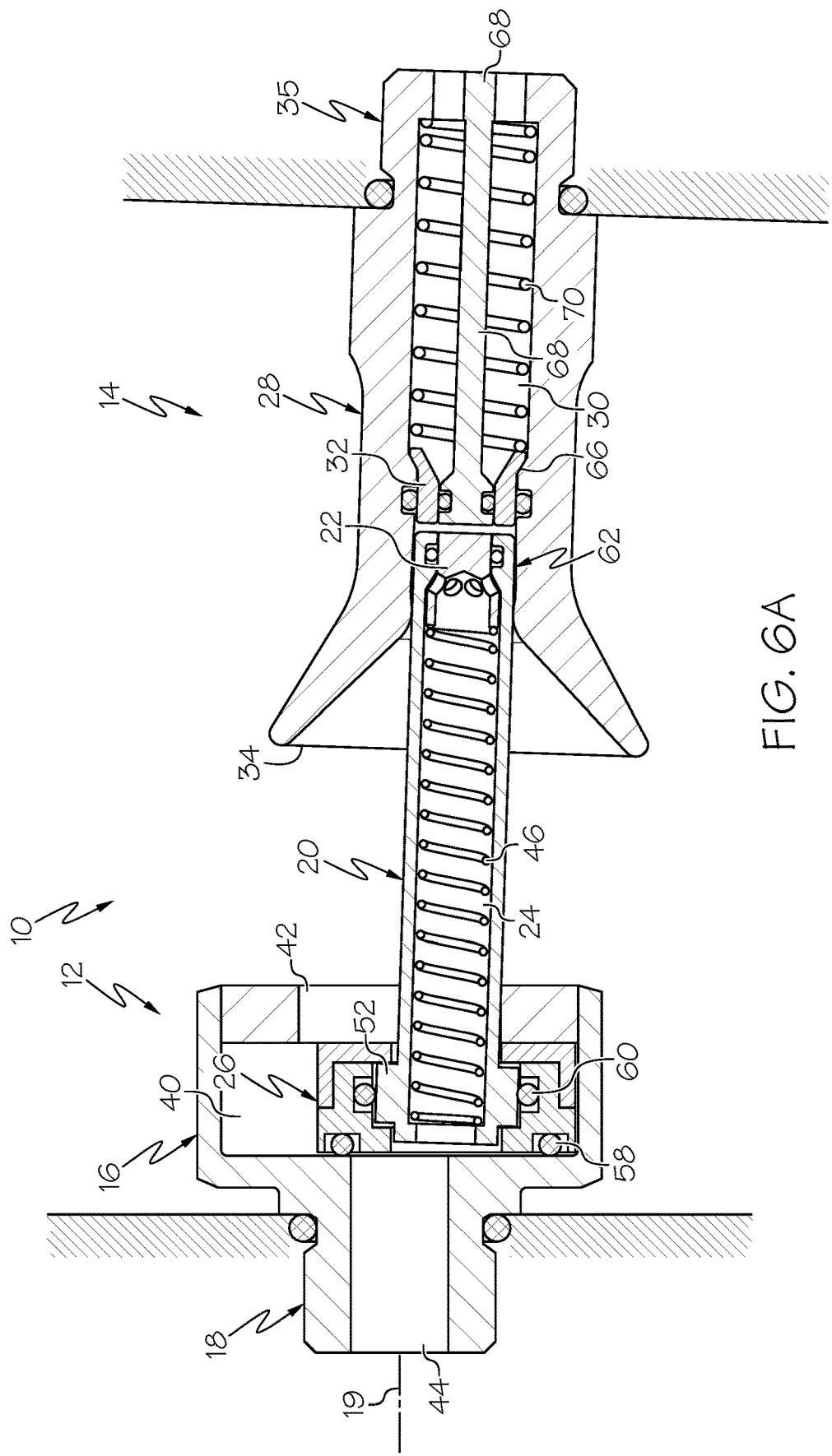
FIG. 6A is a cross-sectional side view of another exemplary embodiment of a blind mate coupling, in which the male member is shown angularly misaligned and in its initial mating and closed state with the female coupling member, in which the nose of the male coupling member has a consistent diameter and the female coupling member has an opening which varies in diameter.
Figure 6B:
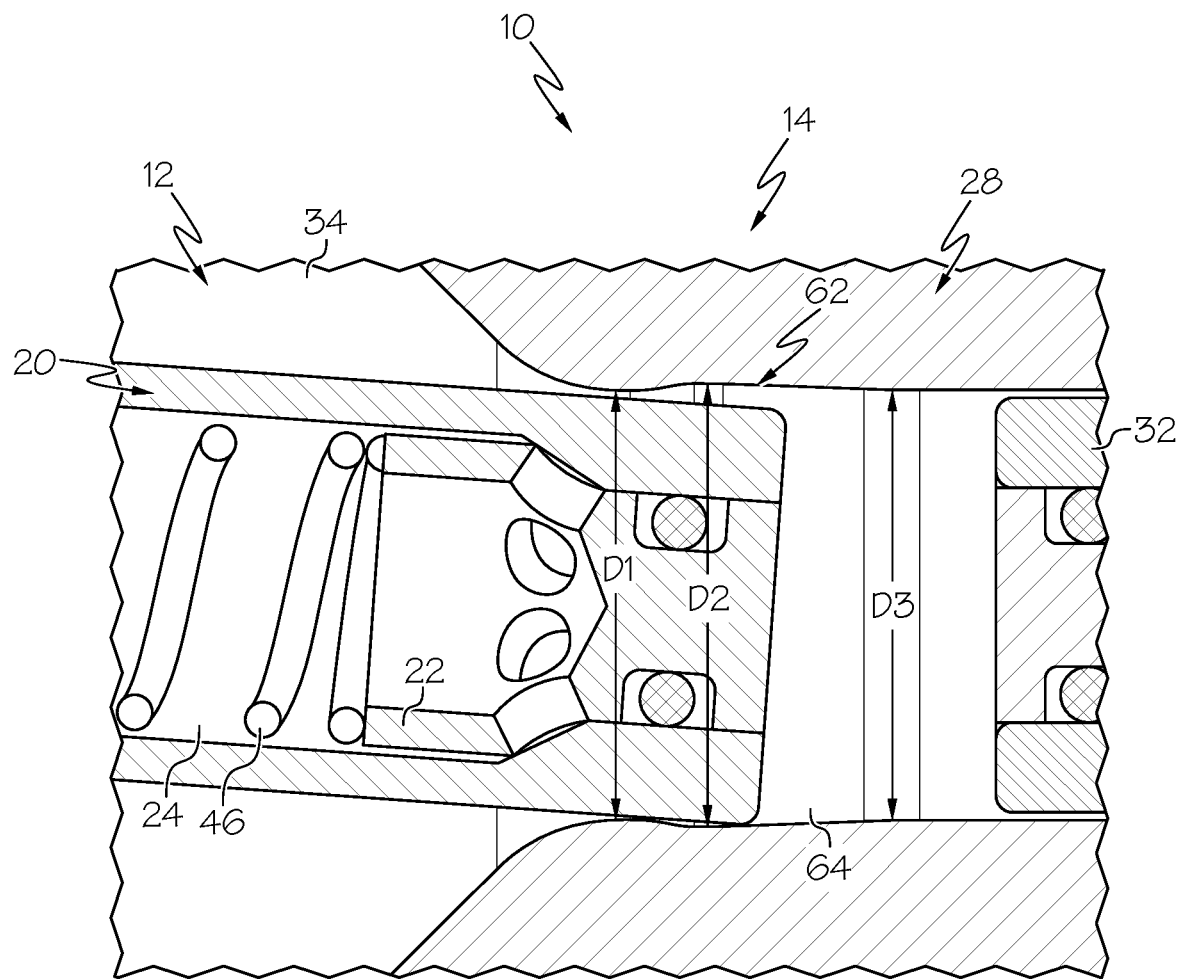
FIG. 6B is an enlarged cross-sectional side view taken from FIG. 6A.
Figure 7:
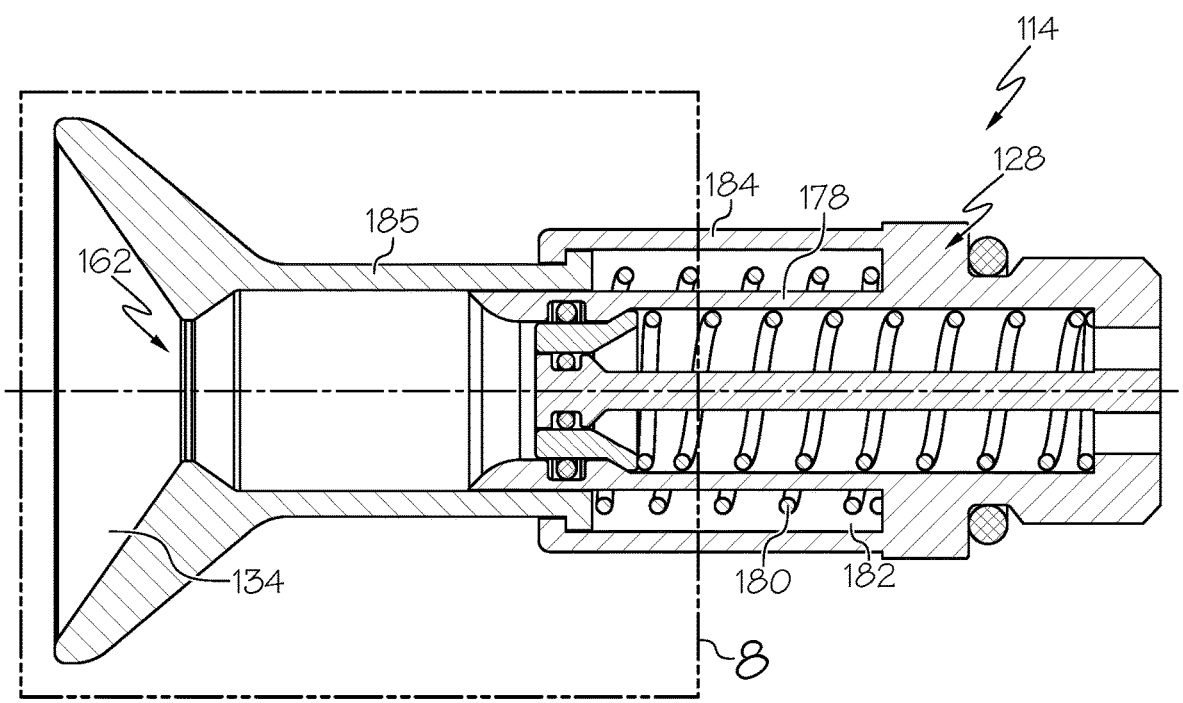
FIG. 7 is a cross-sectional side view of another exemplary female member of another embodiment of a blind mate coupling.
Figure 8:
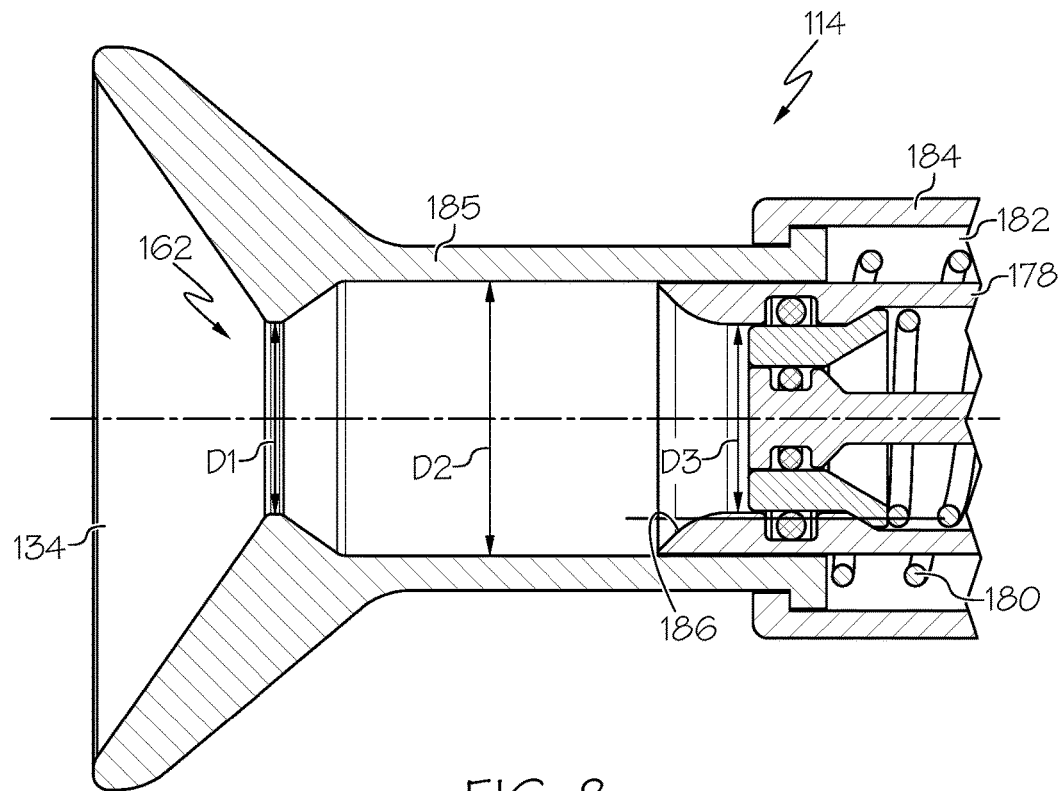
FIG. 8 is an enlarged cross-sectional side view taken from the region shown in FIG. 7.

Turning now to FIGS. 6A and 6B, another exemplary embodiment of a blind mate fluid coupling 10 is shown, including a male member 12 and a female member 14. The blind mate coupling 10 shown in FIGS. 6A and 6B is substantially the same as the above-referenced blind mate coupling 10, except for a varying diameter on the receiving side of the female member 14 instead of the insertion side of the male member 12 (as described below). Consequently, the same reference numerals are used to denote structures corresponding to the same structures in these embodiments. In addition, the foregoing description of the blind mate coupling 10 is equally applicable to the blind mate coupling 10 shown in FIGS. 6A and 6B, except as noted below.

As shown in FIGS. 6A and 6B, the forward receiving portion 62 of the female member 14 has a radially inner surface forming at least part of an internal passage 64 (e.g., a bore 64 or other suitable barrel), in which this internal passage 64 has different internal diameters at longitudinally spaced positions along the internal passage for enabling greater initial misalignment when the nose of the valve body 20 is inserted into the bore 64. In the illustrated embodiment, for example, the receiving portion 62 of the internal passage 64 has a first internal diameter (D1) at a forward portion that receives the forward nose of the valve body 20, a second internal diameter (D2) rearwardly spaced from the first internal diameter (D1), and a third internal diameter (D3) at a location rearwardly spaced apart from the second diameter (D2). As shown, the second internal diameter (D2) is greater than the first (D1) and third (D3) internal diameters for enabling a greater angle of misalignment when the male valve body 20 is initially inserted into the passage 64 of the female member 14. In this manner, the first diameter (D1) may direct the initial positional alignment, the second diameter (D2) may allow for greater angular misalignment, and the combination of the first (D1) and third (D3) diameters may bring the coupling members 12, 14 into full alignment. Such varying diameters are in the forward portion of the receiving portion 62 in a manner that alignment occurs prior to opening of the coupling members 12, 14 when fully-mated. It is noted that in exemplary embodiments, the first (D1) and third (D3) diameters may be different, while in other embodiments the first (D1) and third (D3) diameters may be the same or substantially the same as is shown in the illustrated embodiment. The radially inner surface of the receiving portion 62 forming the internal passage 64 may have a tapered surface, such as a continuous taper (as shown), between the first D1 and second D2 diameters, and a tapered surface (e.g., continuous taper) between the second D2 and third D3 diameters to further facilitate alignment. It is understood, of course, that the receiving internal passage 64 may have more than three different diameters. It is furthermore noted that while the different diameters are shown via a single body of the female member 14, the different diameters also could be provided with different components operatively coupled or cooperating together.

Turning to FIGS. 7-12, another exemplary embodiment of a blind mate fluid coupling 110 is shown, including a male member 112 and a female member 114. The blind mate coupling 110 is substantially similar to the above-referenced blind mate coupling 10, and consequently the same reference numerals but in the 100-series are used to denote structures corresponding to similar structures in the coupling members. In addition, the foregoing description of the blind mate coupling 10 is equally applicable to the blind mate coupling 110, except as noted below. Moreover, it is understood that aspects of the blind mate couplings 10, 110 may be substituted for one another or used in conjunction with one another where applicable.

In the illustrated embodiment, the receiving portion 162 of the female member 114 is similar to the female member 14 shown in FIGS. 6A and 6B, in that the receiving portion 162 of the female member 114 has an internal passage 164 (e.g., bore, barrel, or the like) with different internal diameters at longitudinally spaced positions. In the illustrated embodiment, for example, the internal passage 164 has a first internal diameter (D1) at a forward portion that receives the forward nose of the valve body 120, a second internal diameter (D2) rearwardly spaced from the first internal diameter (D1), and a third internal diameter (D3) at a location rearwardly spaced from the second diameter (D2). As shown, similarly to the embodiment in FIGS. 6A and 6B, the second internal diameter (D2) is greater than the first (D1) and third (D3) internal diameters for enabling a greater angle of misalignment when the male valve body is inserted into passage 164 of the female member 114, while also bringing the coupling members 112, 114 into full alignment when coupled together. As noted above, such varying diameters are in the forward portion of the receiving portion 162 in a manner that alignment occurs prior to opening of the coupling members 112, 114 when fully-mated. Unlike the female member 14 in FIGS. 6A and 6B, the first (D1) and third (D3) diameters of the female member 114 are formed by different components of the female member 114. Nevertheless, tapered surfaces may be provided between the first D1 and second D2 diameters, and between the second D2 and third D3 diameters to further facilitate alignment. In the illustrated embodiment, the first (D1) and third (D3) diameters of the female member 114 are slightly different, although it is understood that the diameters (D1) and (D3) may be the same or substantially the same as each other. As noted above, it is understood that the receiving internal passage 64 may have more than three different diameters.

The female member 114 in FIGS. 7-12 differs from the female member 14 shown in FIGS. 6A and 6B inasmuch as the receiving portion 162 of the female member 114 is axially movable relative to a main body portion 178 of the female valve body 128. More particularly, in the illustrated embodiment, the receiving portion 162 of the female member 114 is biased forwardly with a biasing member 180, such as with a spring 180 contained within a spring chamber 182 of a sleeve portion 184 of the female member 114. An advantage of the axially movable receiving portion 162 is that the overall connected length between the male member 112 and female member 114 can be made as compact as possible while still providing other advantages. For example, such a configuration provides a greater longitudinal distance between the diameters D1 and D3, which can be advantageous in having the overall connection force lowered because the contact forces on the nose of the male valve body 120 are spread apart to a greater extent. In addition, the diameter D2 may be able to be made larger in such a configuration, which can allow for a greater angular misalignment before the nose of the male valve body 120 is fully aligned with the diameter D3, or before the tip of the male valve body 120 has to start a transition from diameters D2 to D3. This greater distance allows for a lower connect and disconnect force. It is understood that although the receiving portion 162 is shown as being forwardly biased with the biasing spring 180, the receiving portion 162 also could be fixed relative to the main body portion 178 and/or may not be spring loaded. In such embodiments, the male member 112 could be made longer to accommodate the greater distance but would still provide similar advantages in connection albeit with a longer connection distance.

As shown in the illustrated embodiment, another advantage of the female member 114 is that the sleeve portion 184 serves as an alignment sleeve that guides axial movement of the receiving portion 162. For example, the receiving portion 162 may include an axially elongated cylindrical portion 185 that is slidably movable in the annular gap between the sleeve portion 184 and the main body portion 178. One advantage of the alignment sleeve is that the sleeve portion 184 and/or the receiving portion 162 may be made of a low friction material, such as plastic, even if the rest of the female member 114 is made of material such as steel or aluminum that have higher sliding friction. A low sliding friction decreases the connect and disconnect force.

Figure 9:
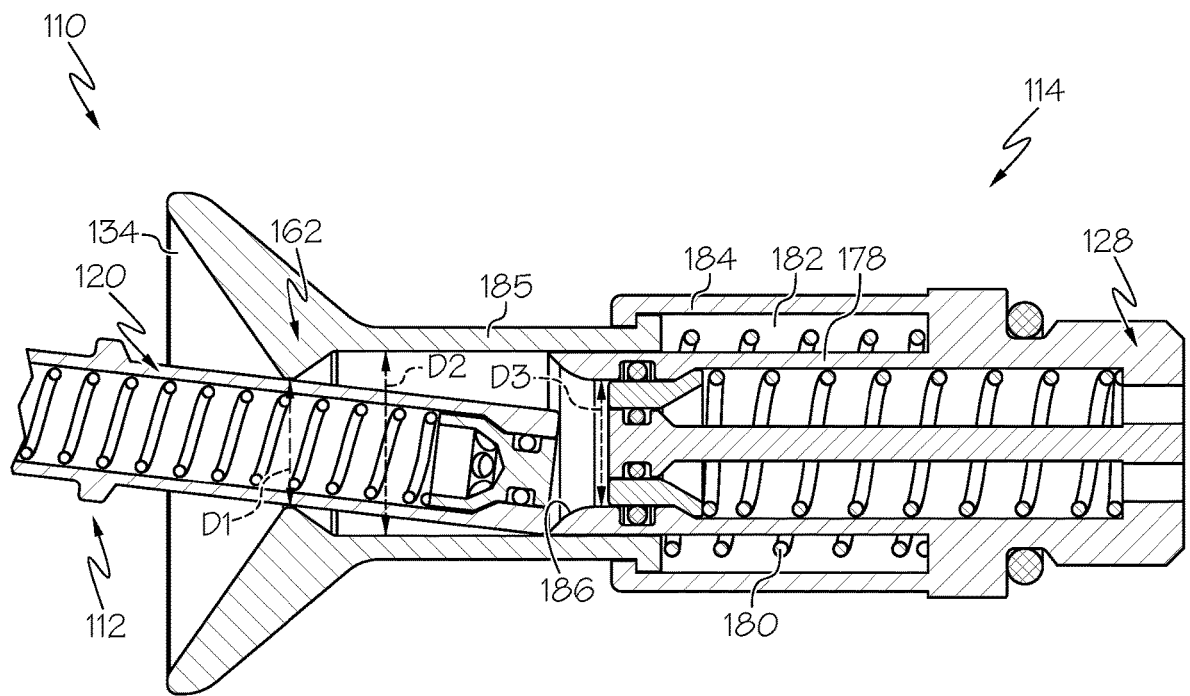
FIG. 9 is a cross-sectional side view of the female member in FIG. 7 shown in an initial mating state with an exemplary male member of the blind mate coupling.
Figure 10:
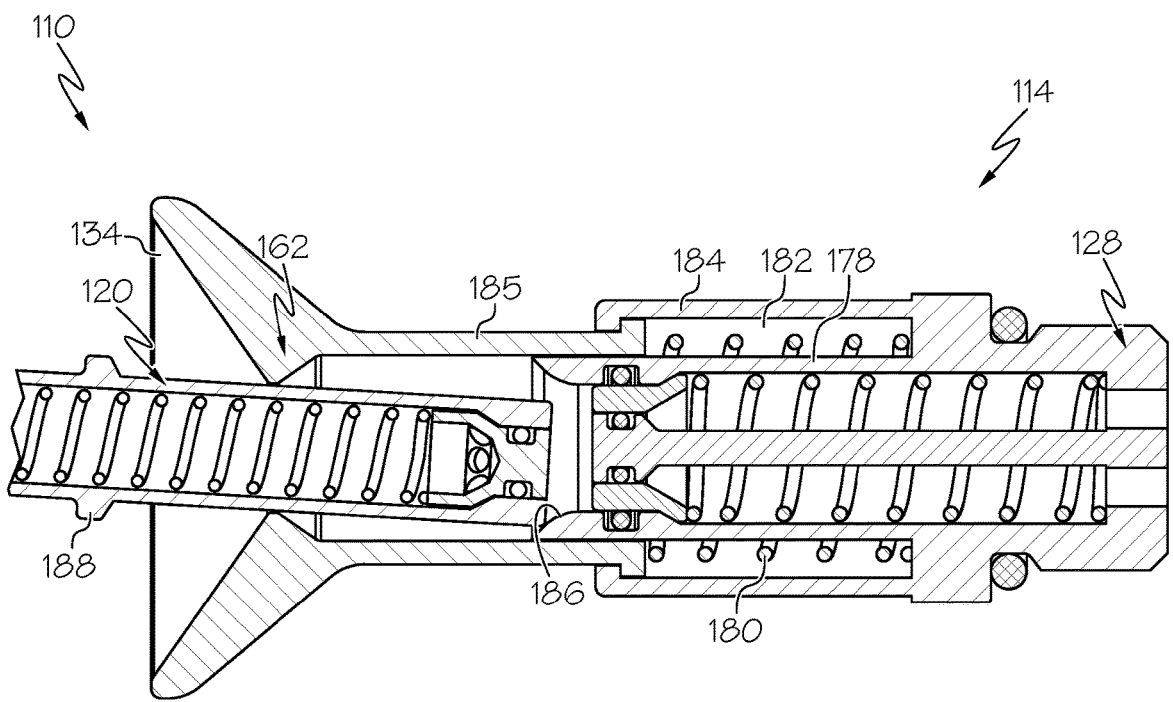
FIG. 10 is a cross-sectional side view of the male member in FIG. 9 shown further inserted into the female member.
Figure 11:
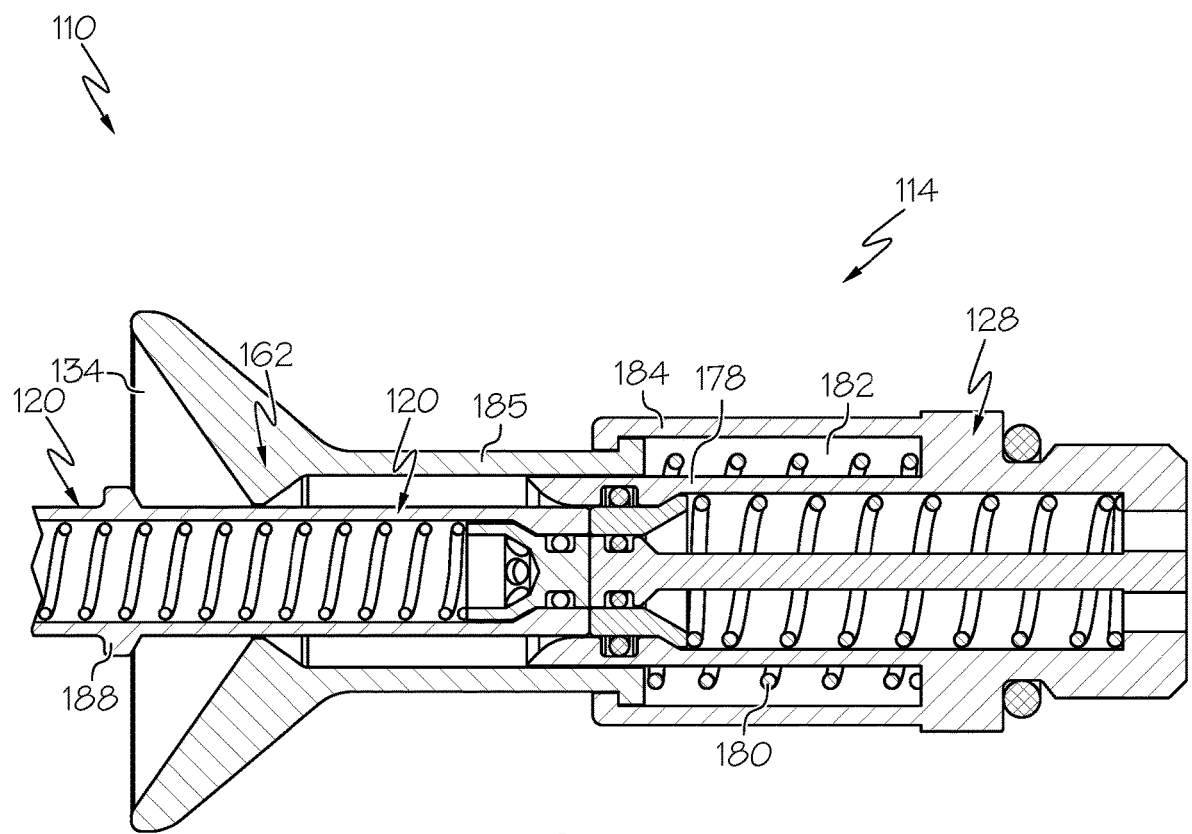
FIG. 11 is a cross-sectional side view of the male member in FIG. 10 shown further inserted into the female member and aligned.

Referring particularly to FIGS. 9-12, an exemplary connection sequence of the male member 112 with the female member 114 is shown. FIG. 9 shows the initial insertion of the nose of the valve body 120 into the receptacle 134 of the receiving portion 162 of the female member 114 when the coupling members 112, 114 are angularly misaligned relative to each other. As shown, the greater diameter D2 at the intermediate portion of the passage 164 (e.g., forwardly of diameter D3) permits for greater angular misalignment. FIG. 10 shows the nose portion of the male valve body 120 engaging the internal surface of the passage 164 constituting the diameter D3. In the illustrated embodiment, this diameter D3 is formed by a forward portion 186 of the main valve body portion 178 of the female member 114. As shown, as the male member 112 is inserted, the nose of the male valve body 120 is urged into alignment by the spaced apart diameters D1 and D3. The forward portion 186 of the female main valve body portion 178 includes a tapered surface that further urges the coupling members 112, 114 into alignment, as shown in FIG. 11.

Figure 12:
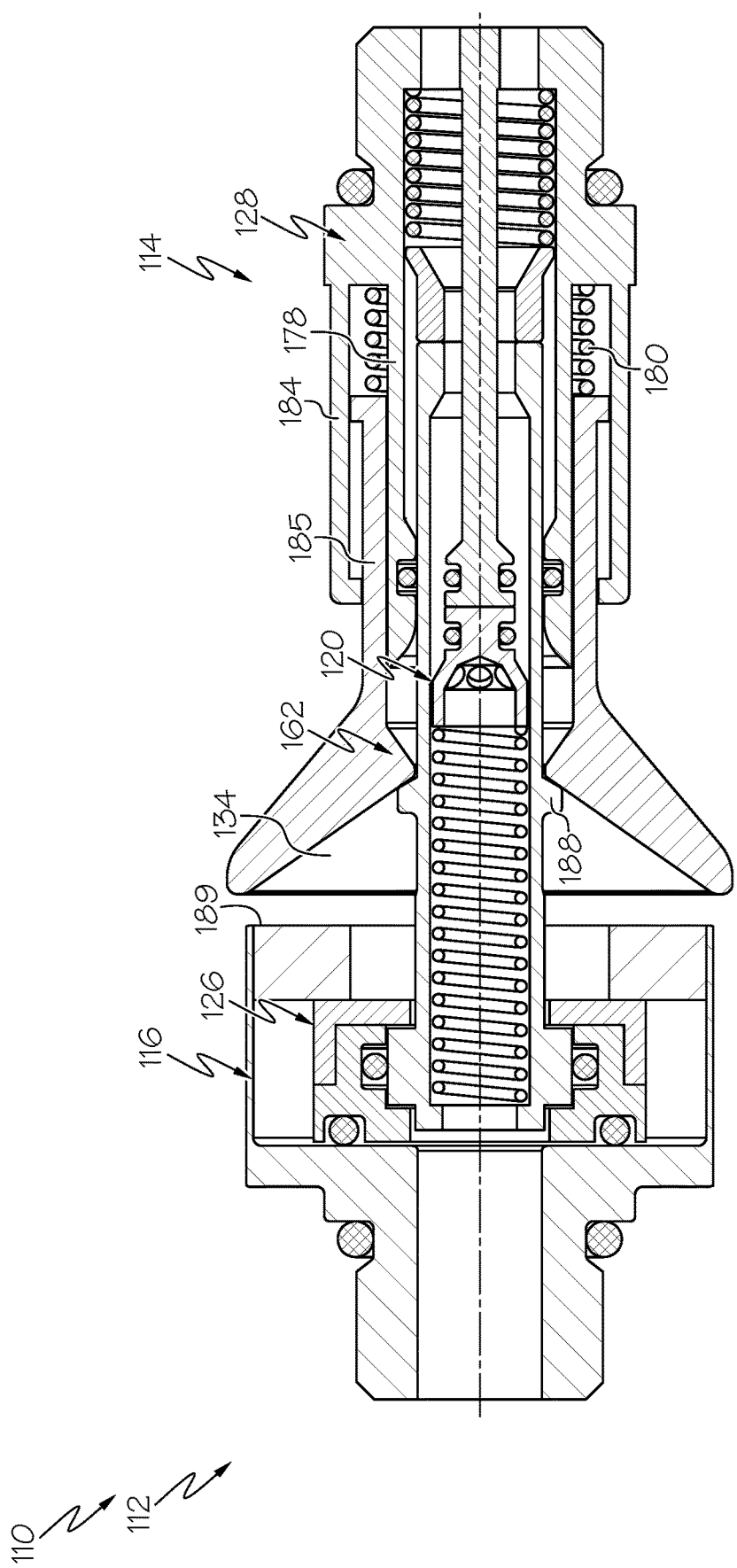
FIG. 12 shows the blind mate coupling in FIG. 11 in a fully coupled and open state.

FIG. 12 shows the coupling members 112, 114 in a fully connected state with the respective coupling members open. As shown, receiving portion 142 of the female member 114 is urged rearwardly by a portion of the male member 114 during the connection sequence. In the illustrated embodiment, for example, the nose portion of the male valve body 120 includes a radially outwardly protruding shoulder 188 that engages an internal surface in the receptacle 134 of the female member 114. As the male member 112 is further inserted, the biasing force provided by the biasing spring 180 is overcome, permitting the receiving portion 142 to move axially relative to the main valve body portion 128 of the female member 114. Although shown with radially protruding shoulder(s) 188 that are fixed (e.g., unitary) with the nose of the male valve body 120, it is understood that the shoulder(s) 188 also could be coupled in a manner that permits floating or movement of the shoulder(s) 188 relative to the main valve body part. In addition, it is understood that male member 112 could be devoid of such shoulder(s), with other portions of the male member 114 being configured to urge the receiving portion 142 rearwardly, for example by engaging a forward face 189 of the male housing 116.

Exemplary blind mate fluid coupling(s) 10, 110 and exemplary coupling member(s) 12, 14, 112, 114 have been described herein. The exemplary coupling member includes a housing and a fluid connector fixed in position relative to the housing for connecting to a fluid conduit of the system. A valve body at least partially extends through the housing and is movable relative to the housing. The valve body includes an internal fluid passage that is fluidly connected to the connector, and a valve member opens or closes the internal fluid passage. A carrier is at least partially disposed in the housing and is radially movable relative to the housing. The carrier is configured to cooperate with the valve body to facilitate alignment of the valve body when coupling to another coupling member. The carrier may form a portion of the fluid passage between the connector and valve body, and includes a sealing arrangement that permits radial and/or angular misalignment compensation of the design. The female member may have a unique receiving portion that further facilitates insertion and alignment of the male member.

While exemplary forms of the blind mate coupling 10, 110 and/or coupling members 12, 14, 112, 114 have been described above, it should be apparent to those having ordinary skill in the art that alternative configurations also could be employed. For example, although the misalignment compensating features are embodied in the male member 12, 112 it is understood that the features described herein could also be applied to the female member 14, 114. In addition, although the housing 16, 116, carrier 26, 126 and valve body 20, 120 are described as being cylindrical to permit displacement about a longitudinal axis, it is also understood that other shapes or forms may permit the desired degree of misalignment compensation.

In addition, although described above in connection with fluid couplings, the exemplary blind mate coupling and coupling member could be used for other applications, such as electrical or optical applications for example. In this context, instead of a valve body with valve member in a fluid passage, the valve body could instead be formed as a main body with a communications passage through which electrical or optical communications lines pass. The forward end of the main body could have a pin connector for engaging a corresponding socket on the female side, for example. The remaining features of the coupling member could be the same as those described above to provide the misalignment compensating functionality.

According to an aspect, a coupling member for a blind mate fluid coupling, includes: a housing; a fluid connector configured to connect to a fluid conduit, the fluid connector being fixed in position relative to the housing; a valve body at least partially extending through the housing and being movable relative to the housing, the valve body having an internal fluid passage that is fluidly connected to the fluid connector; a valve member at least partially disposed in the internal fluid passage, the valve member being movable relative to the valve body to open or close the internal fluid passage; and a carrier at least partially disposed in the housing, the carrier being radially movable relative to the housing and configured to cooperate with the valve body to facilitate alignment of the valve body.

Exemplary embodiments may include one or more of the following additional features, separately or in any combination.

In exemplary embodiment(s), a rearward portion of the valve body is contained within an internal cavity of the carrier such that radial movement of the carrier causes radial movement of the valve body.

In exemplary embodiment(s), a degree of radial movement of the carrier and valve body is based at least in part upon a spacing between a radially outer surface of the carrier and a radially inner surface of a chamber of the housing that contains the carrier.

In exemplary embodiment(s), the rearward portion of the valve body is sized and dimensioned relative to the internal cavity of the carrier to permit angular displacement of the valve body relative to the carrier.

In exemplary embodiment(s), the rearward portion of the valve body includes a radially protruding shoulder that is configured to interact with internal surfaces of the carrier to permit a degree of angular displacement of the valve body.

In exemplary embodiment(s), the carrier includes a radially protruding abutment that is axially forward of the shoulder of the valve body, the abutment being configured to engage the shoulder of the valve body and constrain axially forward movement of the valve body.

In exemplary embodiment(s), the housing includes forward and rearward surfaces that are configured to engage the carrier and constrain axial movement of the carrier relative to the housing.

In exemplary embodiment(s), an internal cavity of the carrier forms at least a portion of a fluid passage that fluidly connects a fluid passage of the fluid connector to the internal fluid passage of the valve body.

In exemplary embodiment(s), a seal arrangement is configured to seal (i) an interface between the carrier and the housing, and (ii) an interface between the carrier and the valve body.

In exemplary embodiment(s), the seal arrangement includes a face seal between a rearward face of the carrier and an internally rearward surface of the housing, the face seal being configured to permit radial displacement of the carrier relative to the housing while maintaining a fluidly sealing engagement between the carrier and the housing.

In exemplary embodiment(s), the seal arrangement includes a seal between a radially outer surface of the valve body and a radially inner surface of the carrier, the seal being configured to permit angular displacement of the valve body relative to the carrier while maintaining a fluidly sealing engagement between the carrier and the valve body.

In exemplary embodiment(s), the fluid connector extends along a first longitudinal axis, and the valve body extends along a second longitudinal axis.

In exemplary embodiment(s), the carrier is configured to permit radial displacement of the valve body relative to the housing such that the first longitudinal axis is offset from the second longitudinal axis.

In exemplary embodiment(s), the carrier is configured to permit angular displacement of the valve body relative to the housing such that the first longitudinal axis is offset from the second longitudinal axis.

In exemplary embodiment(s), a forward nose portion of the valve body is configured for insertion into a receptacle of a female coupling member, wherein the forward nose portion of the valve body has a radially outer surface that forms first, second, and third diameters as respective first, second and third outer diameters of the valve body; wherein the first diameter is toward a forward portion of the valve body, the third diameter is longitudinally spaced apart in a rearward direction from the first diameter, and the second diameter is intermediate the first diameter and the third diameter; and wherein the second diameter is greater or less than both the first diameter and the third diameter for enhanced misalignment when mating with the other coupling member.

According to another aspect, a blind mate coupling includes the coupling member according to any of the foregoing, wherein the coupling member is a male member; and a female coupling member having a receptacle configured to receive a forward end of the valve body of the male member, wherein at least a portion of the receptacle forms an internal passage having a first internal diameter, a second internal diameter, and a third internal diameter; wherein the first internal diameter is toward a forward portion of the receptacle, the third internal diameter is longitudinally spaced apart in a rearward direction from the first internal diameter, and the second internal diameter is intermediate the first internal diameter and the third internal diameter; and wherein the second internal diameter is greater than the first internal diameter and the third internal diameter for enabling enhanced misalignment when the forward end of the valve body is inserted into the internal passage of the female member.

According to another aspect, a coupling member for a blind mate fluid coupling includes: a housing; a valve body at least partially extending through the housing and being movable relative to the housing, the valve body having an internal fluid passage; a valve member at least partially disposed in the internal fluid passage, the valve member being movable relative to the valve body to open or close the internal fluid passage; a fluid connector external of the housing and being configured to connect to a fluid conduit; and a carrier at least partially disposed in the housing, the carrier being movable relative to the housing and configured to cooperate with the valve body to facilitate alignment of the valve body; wherein the carrier includes an internal fluid passage that fluidly interconnects an internal fluid passage of the fluid connector to the internal fluid passage of the valve body.

Exemplary embodiments may include one or more of the following or foregoing additional features, separately or in any combination.

In exemplary embodiment(s), a seal is located at an interface between the carrier and the housing, the seal being configured to permit radial displacement of the carrier relative to the housing while maintaining a fluidly sealing engagement at the interface.

In exemplary embodiment(s), a seal is located at an interface between the carrier and the valve body, the seal being configured to permit angular displacement of the valve body relative to the carrier while maintaining a fluidly sealing engagement at the interface.

According to another aspect, a coupling member for a blind mate fluid coupling, includes: a valve body extending along a longitudinal axis and having an internal fluid passage; a valve member at least partially disposed in the internal fluid passage, the valve member being movable relative to the valve body to open or close the internal fluid passage; wherein a portion of the valve body includes a first diameter, a second diameter, and a third diameter; wherein the first diameter is toward a forward portion of the valve body, the third diameter is longitudinally spaced apart in a rearward direction from the first diameter, and the second diameter is intermediate the first diameter and the third diameter; and wherein the second diameter is greater or less than both the first diameter and the third diameter for enabling enhanced misalignment when mating with another coupling member.

Exemplary embodiments may include one or more of the following or foregoing additional features, separately or in any combination.

In exemplary embodiment(s), the coupling member is a male coupling member having a forward nose portion of the valve body configured for insertion into a receptacle of a female coupling member, wherein the forward nose portion of the valve body has a radially outer surface that forms the first, second, and third diameters as respective first, second and third outer diameters of the valve body.

In exemplary embodiment(s), the coupling member is a female coupling member having a receptacle at a forward end of the valve body configured for receiving part of a male coupling member, wherein at least a portion of the receptacle forms an internal passage having the first, second, and third diameters as respective first, second and third internal diameters.

In exemplary embodiment(s), the receptacle of the valve body forms a receptacle component that is axially movable relative to a main body portion of the valve body.

In exemplary embodiment(s), the receptacle component is forwardly biased with a biasing spring.

In exemplary embodiment(s), the receptacle component is slidably movable and guidable within a sleeve portion of the valve body.

In exemplary embodiment(s), the internal bore is axially forward of the valve member.

In exemplary embodiment(s), a forward portion of the receptacle that is axially forward of the internal bore forms a funnel that tapers radially inwardly toward the internal bore.

As used herein, an "operative connection," or a connection by which entities are "operatively connected," is one in which the entities are connected in such a way that the entities may perform as intended. An operative connection may be a direct connection or an indirect connection in which an intermediate entity or entities cooperate or otherwise are part of the connection or are in between the operatively connected entities. An operative connection or coupling may include the entities being integral and unitary with each other.

It is to be understood that terms such as "top," "bottom," "upper," "lower," "left," "right," "front," "rear," "forward," "rearward," and the like as used herein may refer to an arbitrary frame of reference, rather than to the ordinary gravitational frame of reference.

The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A coupling member for a blind mate fluid coupling, comprising:
a housing;
a fluid connector configured to connect to a fluid conduit, the fluid connector being fixed in position relative to the housing;
a valve body at least partially extending through the housing and being movable relative to the housing, the valve body having an internal fluid passage that is fluidly connected to the fluid connector;
a valve member at least partially disposed in the internal fluid passage, the valve member being movable relative to the valve body to open or close the internal fluid passage; and
a carrier at least partially disposed in the housing, the carrier being radially movable relative to the housing and configured to cooperate with the valve body to facilitate alignment of the valve body,
wherein a rearward portion of the valve body is contained within an internal cavity of the carrier such that radial movement of the carrier causes radial movement of the valve body, wherein the rearward portion of the valve body is sized and dimensioned relative to the internal cavity of the carrier to permit angular displacement of the valve body relative to the carrier.

2. The coupling member according to claim 1,
wherein a degree of radial movement of the carrier and valve body is based at least in part upon a spacing between a radially outer surface of the carrier and a radially inner surface of a chamber of the housing that contains the carrier.

3. The coupling member according to 1,
wherein the rearward portion of the valve body includes a radially protruding shoulder that is configured to interact with internal surfaces of the carrier to permit a degree of angular displacement of the valve body, and
wherein the carrier includes a radially protruding abutment that is axially forward of the shoulder of the valve body, the abutment being configured to engage the shoulder of the valve body and constrain axially forward movement of the valve body.

4. The coupling member according to claim 1,
wherein the housing includes forward and rearward surfaces that are configured to engage the carrier and constrain axial movement of the carrier relative to the housing.

5. The coupling member according to claim 1,
wherein an internal cavity of the carrier forms at least a portion of a fluid passage that fluidly connects a fluid passage of the fluid connector to the internal fluid passage of the valve body, and
wherein a seal arrangement is configured to seal (i) an interface between the carrier and the housing, and (ii) an interface between the carrier and the valve body.

6. The coupling member according to claim 5,
wherein the seal arrangement includes a face seal between a rearward face of the carrier and an internally rearward surface of the housing, the face seal being configured to permit radial displacement of the carrier relative to the housing while maintaining a fluidly sealing engagement between the carrier and the housing.

7. The coupling member according to claim 5,
wherein the seal arrangement includes a seal between a radially outer surface of the valve body and a radially inner surface of the carrier, the seal being configured to permit angular displacement of the valve body relative to the carrier while maintaining a fluidly sealing engagement between the carrier and the valve body.

8. The coupling member according to claim 1,
wherein the fluid connector extends along a first longitudinal axis, and the valve body extends along a second longitudinal axis;
wherein the carrier is configured to permit radial displacement of the valve body relative to the housing such that the first longitudinal axis is offset from the second longitudinal axis; and
wherein the carrier is configured to permit angular displacement of the valve body relative to the housing such that the first longitudinal axis is offset from the second longitudinal axis.

9. The blind mate coupling comprising,
the coupling member according to claim 1, wherein the coupling member is a male member; and
a female coupling member having a receptacle configured to receive a forward end of the valve body of the male member,
wherein at least a portion of the receptacle forms an internal passage having a first internal diameter, a second internal diameter, and a third internal diameter;
wherein the first internal diameter is toward a forward portion of the receptacle, the third internal diameter is longitudinally spaced apart in a rearward direction from the first internal diameter, and the second internal diameter is intermediate the first internal diameter and the third internal diameter; and
wherein the second internal diameter is greater than the first internal diameter and the third internal diameter for enabling enhanced misalignment when the forward end of the valve body is inserted into the internal passage of the female coupling member.

10. A coupling member for a blind mate fluid coupling, comprising:
a housing;
a valve body at least partially extending through the housing and being movable relative to the housing, the valve body having an internal fluid passage;
a valve member at least partially disposed in the internal fluid passage, the valve member being movable relative to the valve body to open or close the internal fluid passage;
a fluid connector external of the housing and being configured to connect to a fluid conduit; and
a carrier at least partially disposed in the housing, the carrier being movable relative to the housing and configured to cooperate with the valve body to facilitate alignment of the valve body;
wherein the carrier includes an internal fluid passage that fluidly interconnects an internal fluid passage of the fluid connector to the internal fluid passage of the valve body,
wherein at least one seal is located at an interface between the carrier and the housing, the seal being configured to permit radial displacement of the carrier relative to the housing while maintaining a fluidly sealing engagement at the interface.

11. The coupling member according to claim 10,
wherein at least one second seal is located at an interface between the carrier and the valve body, the second seal being configured to permit angular displacement of the valve body relative to the carrier while maintaining a fluidly sealing engagement at the interface.

12. A coupling member for a blind mate fluid coupling, comprising:
a valve body extending along a longitudinal axis and having an internal fluid passage;
a valve member at least partially disposed in the internal fluid passage, the valve member being movable relative to the valve body to open or close the internal fluid passage;
wherein a portion of the valve body includes a first diameter, a second diameter, and a third diameter;
wherein the first diameter is toward a forward portion of the valve body, the third diameter is longitudinally spaced apart in a rearward direction from the first diameter, and the second diameter is intermediate the first diameter and the third diameter; and
wherein the second diameter is greater or less than both the first diameter and the third diameter for enabling enhanced misalignment when mating with another coupling member.

13. The coupling member according to claim 12, wherein the coupling member is a male coupling member having a forward nose portion of the valve body configured for insertion into a receptacle of a female coupling member, wherein the forward nose portion of the valve body has a radially outer surface that forms the first, second, and third diameters as respective first, second and third outer diameters of the valve body.

14. The coupling member according to claim 13, wherein the second diameter of the male coupling member is less than both the first diameter and the third diameter for enabling enhanced misalignment when mating with the female coupling member.

15. The coupling member according to claim 12, wherein the coupling member is a female coupling member having a receptacle at a forward end of the valve body configured for receiving part of a male coupling member, wherein at least a portion of the receptacle forms an internal passage having the first, second, and third diameters as respective first, second and third internal diameters.

16. The coupling member according to claim 15, wherein the second diameter of the female coupling member is greater than both the first diameter and the third diameter for enabling enhanced misalignment when mating with the male coupling member.

17. The coupling member according to claim 15, wherein the receptacle of the valve body forms a receptacle component that is axially movable relative to a main body portion of the valve body.

18. The coupling member according to claim 17, wherein the receptacle component is forwardly biased with a biasing spring.

19. The coupling member according to claim 17, wherein the receptacle component is slidably movable and guidable within a sleeve portion of the valve body.

* * * * *